US006207333B1

(12) United States Patent
Adair et al.

(10) Patent No.: US 6,207,333 B1
(45) Date of Patent: Mar. 27, 2001

(54) MASK WITH ATTENUATING PHASE-SHIFT AND OPAQUE REGIONS

(75) Inventors: William J. Adair; James J. Colelli, both of Jericho; Erik A. Puttlitz, Colchester; Timothy J. Toth; Arthur C. Winslow, both of Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/363,862

(22) Filed: Jul. 29, 1999

(51) Int. Cl.$^7$ ........................................................ G03F 9/00
(52) U.S. Cl. ................................................................ 430/51
(58) Field of Search ............................. 430/5, 322, 323, 430/324

(56) References Cited

U.S. PATENT DOCUMENTS

| 5,506,080 | 4/1996 | Adair et al. | 430/5 |
|---|---|---|---|
| 5,589,303 | 12/1996 | DeMarco et al. | 430/5 |
| 5,591,550 | * 1/1997 | Choi et al. | 430/5 |
| 5,888,674 | * 3/1999 | Yang et al. | 430/5 |
| 6,077,633 | * 3/1999 | Lin et al. | 430/5 |

* cited by examiner

Primary Examiner—S. Rosasco
(74) Attorney, Agent, or Firm—Richard M. Kotulak

(57) ABSTRACT

A method of fabricating an attenuating phase shift photolithographic mask which will reduce the formation of sidelobes adjacent to large structures in the kerf regions on the patterned wafer. These structures are typically much larger in size than device nominal, and this method may be applied to either one axis or both axes of the kerf structure depending on it's susceptibility to form side-lobes.

A substantially defect free optical lithography mask having partially transmissive attenuating phase-shift regions, transmissive clear regions, and more opaque than partially transmissive regions is fabricated by first depositing an attenuating phase-shifting layer on the top surface of a transmissive substrate followed by deposition of a more opaque than partially transmissive layer on top of the partially transmissive attenuating phase-shifting layer. Next an image transfer layer is deposited on top of the more opaque than partially transmissive layer. A first photolithographic step is performed in order to pattern the image transfer layer. The image transfer layer may then be inspected and repaired. The pattern in the image transfer layer is then transferred to both the more opaque than partially transmissive layer and partially transmissive attenuating phase-shift layer. Next a second photolithographic step is performed in order to remove the more opaque than partially transmissive layer from over the partially transmissive attenuating phase-shift layer in certain regions of the mask. The fabrication process may include the further steps of depositing a second image transfer layer before performing the second photolithographic step, and performing a second inspection and repair after the second photolithographic step. The image transfer layer(s) are then removed.

22 Claims, 7 Drawing Sheets

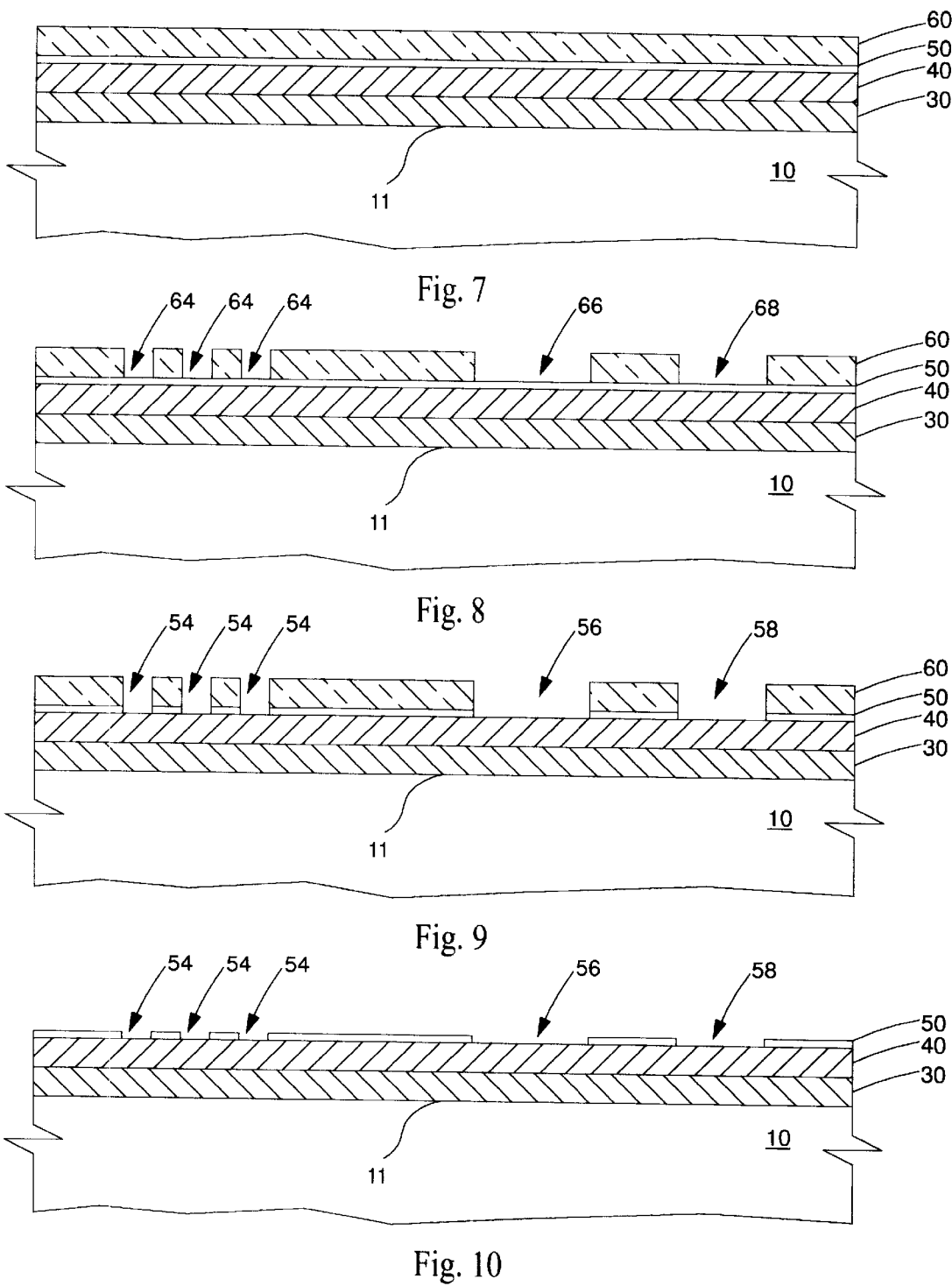

MASK WITH ATTENUATING PHASE-SHIFT AND OPAQUE REGIONS

FIELD OF THE INVENTION

The present invention relates to the field of optical lithography; more specifically, it relates to an improved method for making attenuating phase-shift masks used in optical lithography.

BACKGROUND OF THE INVENTION

Current semiconductor device technology requires fabrication of very small structures on the semiconductor substrate. In turn these structures are fabricated using photolithographic process. In this process light is projected though a mask to produce an aerial image which is then directed to a photoresist layer coated on semiconductor substrate thereby exposing the photoresist layer. After a developing process, an image is formed in the photoresist layer. This image is used as an etch mask to produce the structures on the semiconductor wafer.

Typically these structures are of the order of 0.18 to 0.25 micron in minimum dimension and smaller minimum dimensions can be expected as semiconductor technology advances. At these dimensions light interference phenomenon become important considerations and special masks are required to take this interference phenomenon into account to allow reproduction of the mask image in the developed photoresist layer accurately and without distortions. One such type of mask is called an attenuated phase-shifting mask (APSM). In such a mask an image is formed in a partially transmissive layer on a transmissive substrate. Light passing through the partially transmissive layer is 180° out of phase from light passing through only the transmissive substrate. This results in destructive interference at the edges of the aerial image, giving a sharper edge and truer reproduction of the mask image. A drawback to this type of mask is an increase in the intensity of the secondary or side lobes of the aerial image, which if they become large enough can result in exposure of resist adjacent to certain image edges. Another consideration that needs to be taken into account is as image sizes decrease, the intensity of light needed to expose small images increases, but the intensity of light required to expose larger images does not increase as rapidly. This means larger images can be overexposed. While simple overexposure can often be accounted for by mask image size compensation, side lobe exposure can not. In attenuated phase-shift masks, when small images are exposed properly large images can often be seen to have additional adjacent images called side lobe images after development. This is illustrated in FIGS. 1 though 3.

FIG. 1 is a plan view of a portion of a conventional attenuating phase-shift mask. The mask is comprised of transmissive substrate 10 having a partially transmissive attenuating phase-shift region on transmissive substrate 10. Partially transmissive attenuating phase-shift region 12 contains mask images 14 and mask images 16 and 18. As depicted mask images 14, 16, and 18 are transmissive clear spaces although many of the concepts described here are applicable to opaque images also.

FIG. 2 is a plan view of a portion of a photoresist coated wafer exposed with the mask of FIG. 1. FIG. 3 is a partial cross-sectional view of the photoresist coated wafer of FIG. 2 through section AA of FIG. 2. Wafer photoresist layer 22 has been coated on top surface 21 of wafer 20. Images 24 have been formed in region 25 of wafer photoresist layer 22 and images 26 and 28 formed in region 29 of wafer photoresist layer 22. As can be seen side lobe images 26A have been formed along two sides of image 26 and side lobe images 28A and 28B have been formed along four sides of image 28 in photoresist layer 22. Side lobing can be a major concern when the larger images become approximately three times larger in at least one dimension then the smaller images. For example if images 24 are 0.4 by 0.4 micron in size and image 26 is 0.4 by 1.2 micron in size, and image 28 is 1.2 by 1.2 micron in size, the significant side lobing shown in FIGS. 2 and 3 will result. Considering that many kerf images for structures such as alignment marks and measurement marks (such as used for overlay) are very large compared to the smallest device images, side lobe images are produced that make edge detection of the instruments that use these marks very difficult and inaccurate. Side lobes also create problems on very large critical device structures.

Turning to the prior art, U.S. Pat. No. 5,589,303 to DeMarco et. al., teaches how an attenuating phase-shifting optical lithographic mask is fabricated, in a specific embodiment of the invention, by first depositing a uniformly thick molybdenum silicide layer on a top planar surface of quartz. The molybdenum silicide layer has a thickness sufficient for acting as an attenuating (partially transparent) layer in a phase-shifting mask. A uniformly thick chromium layer is deposited on the molybdenum silicide layer. The chromium layer has a thickness sufficient for acting as an opaque layer in the phase-shifting mask. Next, the chromium layer is patterned by dry or wet etching, while the chromium layer is selectively masked with a patterned resist layer. Then molybdenum silicide is patterned by dry or wet etching, using the patterned chromium layer as a protective layer, whereby a composite layer of molybdenum silicide and chromium is formed having mutually separated composite stripes. Any remaining resist is removed. Next the top and sidewall surfaces of some, but not others, of these mutually separated stripes are coated with a second patterned resist layer. Finally, the chromium layer, but not the molybdenum suicide layer, is removed from the others of the mutually separated composite stripes.

A drawback to the prior art methods is the difficulty of repairing the mask after fabrication as repair of attenuating phase-shifting layers tends to introduce other undesirable defects, and attenuated phase-shift masks are particularly difficult to repair after fabrication because of the need to keep the material in the region of the repair the same thickness as the surrounding material, and of the same composition in order to match phase-shifting capability and light transmission.

U.S. Pat. No. 5,506,0809 to Adair et. al., (hereby incorporated by reference) teaches a method of forming a substantially defect-free mask for optical and phase-shift lithography. The method involves depositing a transfer layer on a mask layer deposited on a transmissive substrate, forming in the transfer layer a mask image to be defined in the mask layer, inspecting the image formed in the transfer layer, repairing the image formed in the transfer layer, and transferring the corrected image from the transfer layer into the mask layer. The repair of the transfer layer is accomplished by removing unwanted portions of the transfer layer followed by filling any unwanted voids therein with selected material. Preferably, the fill material has the same desirable etching and/or optical characteristics as the surrounding transfer layer. However, any material that is substantially opaque to the radiation used to transfer the image from the transfer layer to the mask layer or resistant to the etch chemistries used can be successfully employed.

Accordingly, there exists a need for an improved method of fabricating an attenuating phase-shift mask that solves the side lobe imaging problem and ameliorates the need for post fabrication repair.

SUMMARY OF THE INVENTION

It is an object of the present invention to provide an improved mask making process for attenuated phase-shift masks comprised of partially transmissive attenuated phase-shifting regions, transmissive clear regions, and more opaque than partially transmissive regions that reduces the occurrence of side-lobe formation in either the device or kerf (sometimes called street) areas of wafers processed with the mask without inducing defects on the mask. This process may be applied to either one axis or both axes of a structure depending on its susceptibility to side-lobe generation as illustrated in FIG. 2, images 26, 26A, 28, 28A, and 28B.

It is a further object of the present invention to provide an improved mask making process for attenuated phase-shift masks comprised of partially transmissive attenuated phase-shifting regions, transmissive clear regions, and more opaque than partially transmissive regions, that includes repair of phase-shifting regions, transmissive clear regions, and non-transmissive opaque regions, during fabrication of the mask and before transmissive clear regions have been formed in either the partially transmissive attenuated phase-shifting area or the more opaque than partially transmissive area.

It is yet another object of the present invention to provide a method of fabricating defect free masks comprised of partially transmissive attenuated phase-shifting regions, transmissive clear regions, and more opaque than partially transmissive regions, that includes repair during fabrication of the mask using other than phase-shifting materials for repair.

These objects of the present invention are realized by fabrication of an optical lithography mask having partially transmissive attenuating phase-shift regions, transmissive clear regions, and more opaque than partially transmissive regions by the steps of:

first depositing a partially transmissive attenuating phase-shifting layer on the top surface of a transmissive substrate followed by deposition of a more opaque than partially transmissive layer on top of the partially transmissive attenuating phase-shifting layer;

depositing an image transfer layer on top of the more opaque than partially transmissive layer and performing a first photolithographic step in order to pattern the image transfer layer;

inspecting and repairing the image transfer layer;

transferring the pattern in the image transfer layer to both the more opaque than partially transmissive layer and partially transmissive attenuating phase-shift layer;

performing a second photolithographic step in order to remove the more opaque than partially transmissive layer from over the partially transmissive attenuating phase-shift layer in certain regions of the mask.

The fabrication process may include the further steps of depositing a second image transfer layer before performing the second photolithographic step, and performing an additional inspection and repair after the second photolithographic step. The image transfer layer(s) are then removed.

BRIEF DESCRIPTION OF DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 7 through 17 are partial cross-sectional views of successive stages of fabrication of the partially transmissive attenuating phase-shift mask in accordance with an embodiment of the present invention;

DETAILED DESCRIPTION OF THE INVENTION

Figure 1:
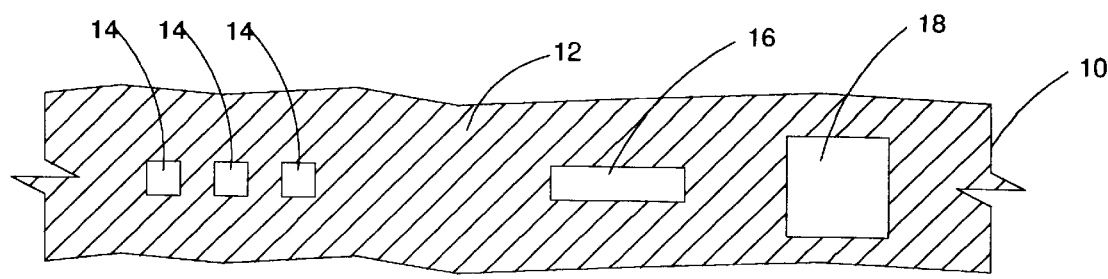
FIG. 1 is a plan view of a portion of a conventional partially transmissive attenuating phase-shift mask.
Figure 2:
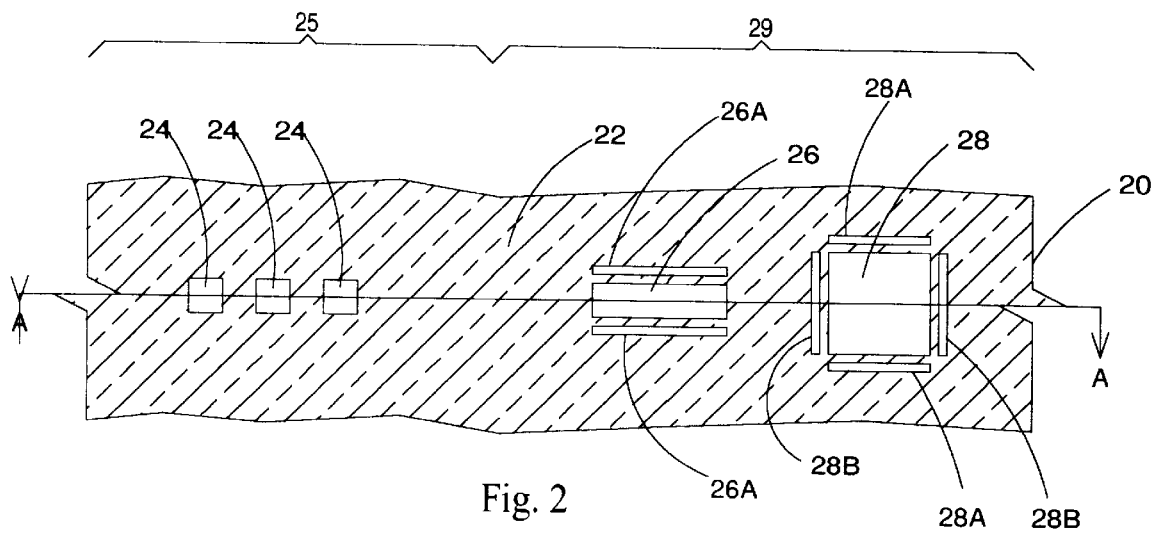
FIG. 2 is a plan view of a portion of a photoresist coated wafer exposed with the mask of FIG. 1.
Figure 3:
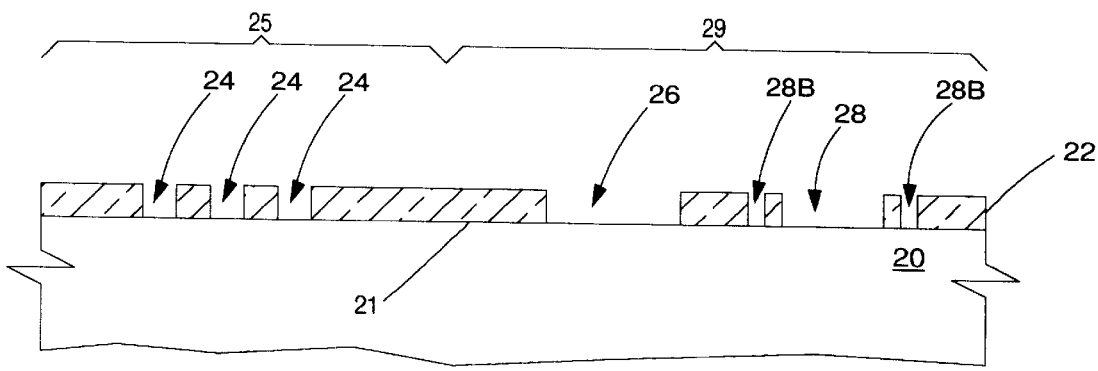
FIG. 3 is a partial cross-sectional view of the photoresist coated wafer of FIG. 2 through section AA of FIG. 2.
Figure 4:
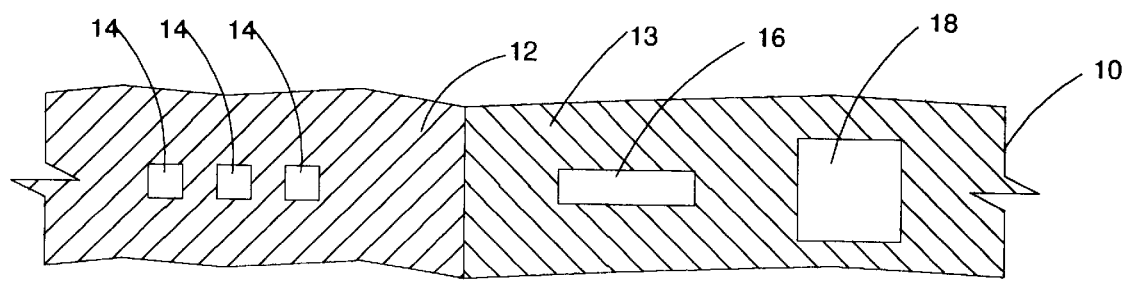
FIG. 4 is a plan view of a portion of a partially transmissive attenuating phaseshift mask of the present invention.
Figure 5:
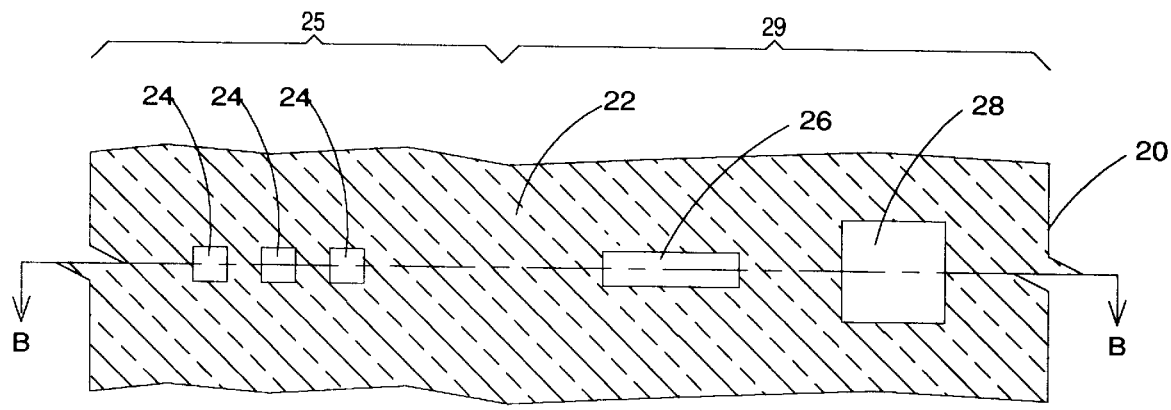
FIG. 5 is a plan view of a portion of a photoresist coated wafer exposed with the mask of FIG. 4.
Figure 6:
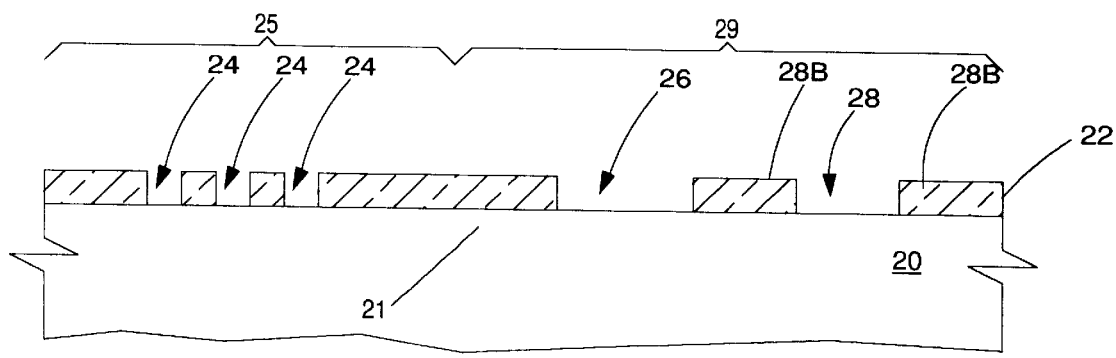
FIG. 6 is a partial cross-sectional view of the photoresist coated wafer of FIG. 4 through section BB of FIG. 5.

A goal of the present invention is to describe a method of fabrication that results in a mask as illustrated in FIGS. 4 through 6 and described below. FIG. 4 is a plan view of a portion of a partially transmissive attenuating phase-shift mask of the present invention. The mask is comprised of transmissive substrate 10 having partially transmissive attenuating phase-shift region 12 and more opaque than partially transmissive (maybe completely opaque or more opaque than the partially transmissive attenuated region) region 13 on transmissive substrate 10. Partially transmissive attenuating phase-shift region 12 is comprised of a partially transmissive attenuating phase-shift layer on transmissive substrate 10. More opaque than partially transmissive region 13 is comprised of a dual more opaque than partially transmissive layer on top of the partially transmissive attenuating phase layer. Partially transmissive attenuating phase-shift region 12 contains mask images 14 and more opaque than partially transmissive region 13 contains mask images 16 and 18. As depicted mask images 14, 16, and 18 are clear spaces. It is primarily intended that mask images 14 be located within the area of the mask corresponding to the device or active region of the die the mask is intended to fabricate. Mask images 16 and 18 are intended to be located within the area of the mask corresponding to the kerf or street region around the active region of the die the mask is intended to fabricate such that the more opaque than partially transmissive regions 13 are coincident with the regions adjacent to the larger than nominial device-sized structures where side-lobes may occur. However, since regions 13 are intended to contain larger mask images and region 12 smaller mask images, regions of partially transmissive attenuating phase-shift layer only may also be formed in the kerf regions of the mask, and regions of more opaque than partially transmissive layer over partially transmissive attenuating phase-shift layer may also be formed in the active regions of the mask.

FIG. 5 is a plan view of a portion of a photoresist coated wafer exposed with the mask of FIG. 4 and FIG. 6 is a partial cross-sectional view of the photoresist coated wafer of FIG. 4 through section BB of FIG. 5. Wafer photoresist layer 22 has been coated on top surface 21 of wafer 20. Images 24 have been formed in region 25 of wafer photoresist layer 22 and images 26 and 28 formed in region 29 of wafer photoresist layer 22. No side lobes have been formed. Again it is primarily intended that images 24 be located within the active region of the die and images 26 and 28 are located within the kerf region around the die, but use of the invention is not restricted to larger images in the kerf region or smaller images in the device region.

Turning to the fabrication of the mask of the present invention. FIGS. 7 through 17 are partial cross-sectional views of successive stages of fabrication of the attenuating phase-shift mask in accordance with the present invention. In FIG. 7 transmissive substrate 10 has been provided with partially transmissive attenuating phase-shift layer 30 on major surface 11 of transmissive substrate 10. Transmissive substrate 10 may be comprised of quartz, boro-silicate glass, or other suitable material. Partially transmissive attenuating phase-shift layer 30 may be comprised of molybdenum silicide 800 to 1,000 Å thick having a transmission in the range of 3 to 30%, 4 to 8% preferred, of the energy of the wavelength of light to which wafer photoresist layer 22 is photo-active. More opaque than partially transmissive layer 40 has been formed on partially transmissive attenuating phase-shift layer 30. More opaque than partially transmissive layer 40 may be comprised of chrome, molybdenum, aluminum, tungsten, titanium, or oxides of these metals in thickness from 500 to 2,000 Å or sufficiently thick that in combination with partially transmissive attenuating phase-shift layer 30, substantially 100% of the energy of wavelength of light to which wafer photoresist layer 22 is photo-active is blocked. Formed on more opaque than partially transmissive layer 40 is first image transfer layer 50. Image transfer layer 50 may be comprised of carbon, silicon nitride, or silicon carbide, photoresist, or other suitable materials 100 to 1,000 Å thick such that the partially transmissive, and more opaque than partially transmissive layers may be selectively etched relative to the image transfer layer. Image transfer layer 50 can be used to enhance the sharpness of the transfer images edges from the photoresist image to the underlying layers that might otherwise be lost by erosion or lifting of the photoresist layer during etch of the underlying layers. It can also serve as a defect repair layer prior to etching the underlying layers. On top of first image transfer layer 50 is first photoresist layer 60.

In FIG. 8 first photoresist images 64, 66, and 68 have been formed in first photoresist layer 60 by standard mask fabrication exposure and development processes, thereby exposing first image transfer layer 50 at the bottom of first photoresist images 64, 66, and 68. In FIG. 9 first image transfer layer 50 has been etched, using now patterned first photoresist layer 60 as an etch mask, forming first image transfer layer images 54, 56, and 58 in first image transfer layer 50, thereby exposing more opaque than partially transmissive layer 40 at the bottom of first transfer layer images 54, 56, and 58. If first image transfer layer 50 is silicon nitride, for example, etching could be accomplished using a plasma or reactive ion etch using flourine and oxygen. In FIG. 10 first photoresist layer 60 has been removed. At this point an inspection of now patterned first image transfer layer 50 for defects may be done and repairs performed. Both clear and opaque type defects may be repaired.

Figure 11:
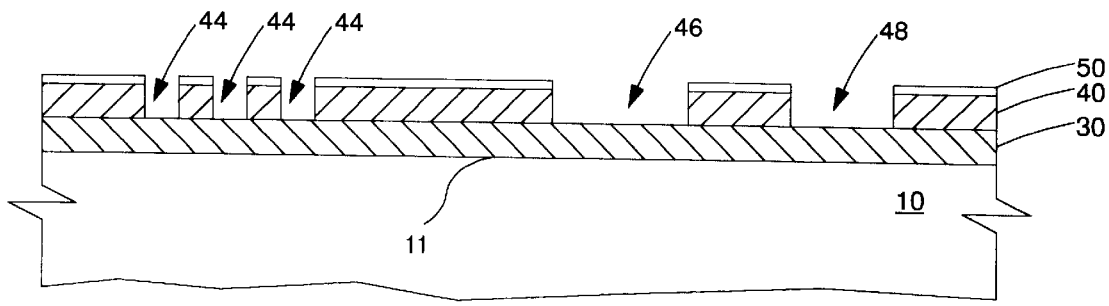
Figure 12:
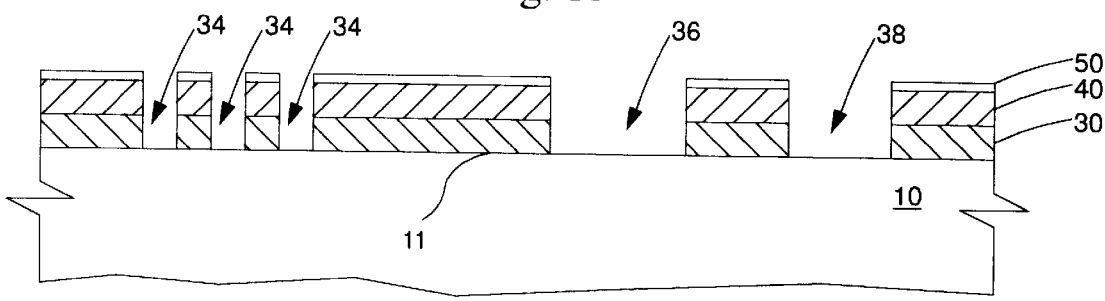
Figure 13:
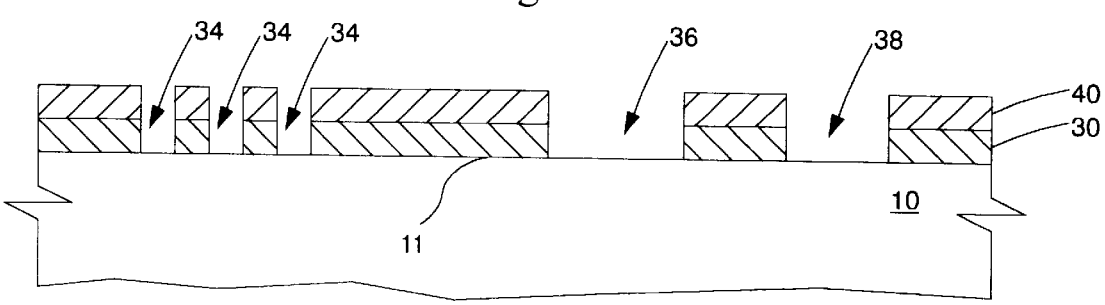

In FIG. 11 more opaque than partially transmissive layer 40 has been etched using now patterned first image transfer layer 50 as an etch mask. This results in the formation of more opaque than partially transmissive layer images 44, 46, and 48 in more opaque than partially transmissive layer 40. Partially transmissive attenuating phase-shift layer 30 is exposed at the bottom of more opaque than partially transmissive images 44, 46, and 48. If more opaque than partially transmissive layer 40 is chrome, for example, etching could be accomplished using a wet etch of $HClO_3$ and $Ce(NH_4)_2(NO_3)_6$ or dry etching with $Cl_2$ and $O_2$. In FIG. 12 partially transmissive attenuating phase-shift layer 30 has been etched using now patterned more opaque than partially transmissive layer 40 as an etch mask, forming partially transmissive attenuating phase-shift layer images 34, 36, and 38 in partially transmissive attenuating phase-shift layer 30 and thereby exposing transmissive substrate 10 at the bottom of partially transmissive attenuating phase-shift layer images 34, 36, and 38. Partially transmissive attenuated phase-shift layer 30 may be etched, for example, using plasma or reactive ion etch using $CF_4$ and $O_2$. An inspection and repair of the more opaque than partially transmissive layer can be performed prior to etching the partially transmissive attenuating phase shift layer. In FIG. 13 first image transfer layer 50 has been removed. Optionally, first image transfer layer may be left in place until after partially transmissive attenuating phase-shift layer 30 is etched as described below. At this point the fabrication sequence all images on the mask have been formed through both more opaque than partially transmissive layer 40 and partially transmissive attenuating phase-shift layer 30. The next fabrication steps will remove more opaque than partially transmissive layer 40 from over partially transmissive attenuating phase-shift layer in specific regions of the mask, specifically in regions having minumum (nominal or sub-nominal) device size images.

Figure 14:
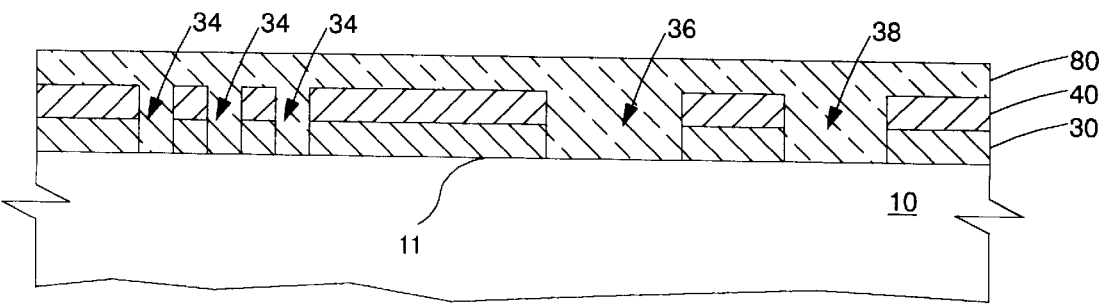
Figure 15:
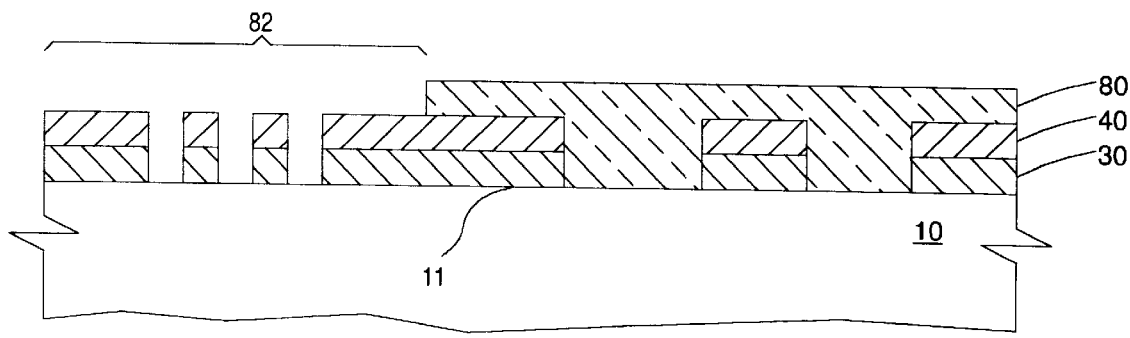
Figure 16:
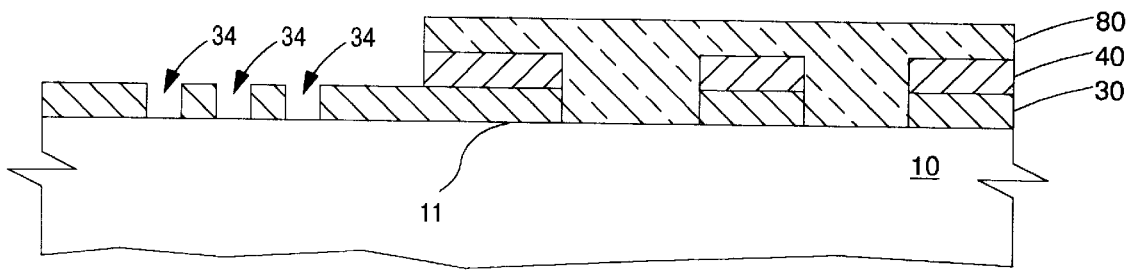
Figure 17:
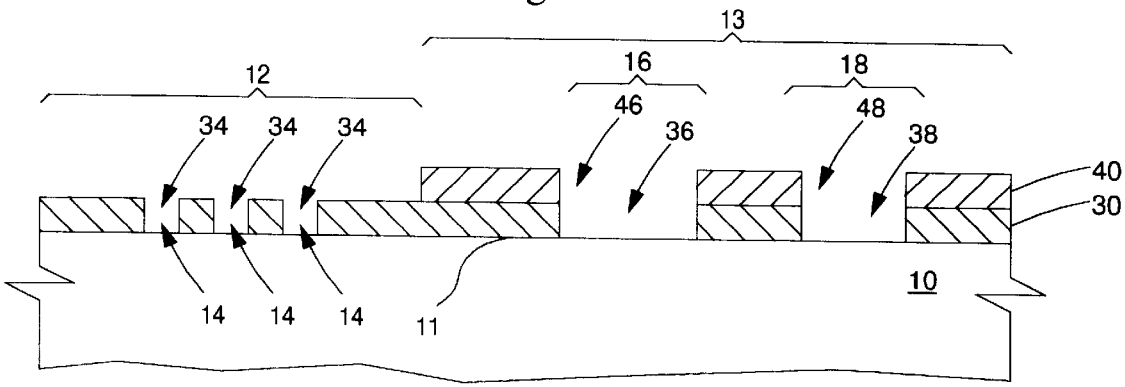

FIGS. 14 through 17 describe a first embodiment for completion of the mask fabrication of the present invention. In FIG. 14 second photoresist layer 80 has formed over transmissive substrate 10 and covering more opaque than partially transmissive layer 40 and exposed surface 11 of transmissive substrate 10. In FIG. 15 second photoresist image 82 has been formed in second photoresist layer 80 by standard mask fabrication exposure and development processes, thereby exposing those portions of now patterned more opaque than partially transmissive layer 40 contained within second photoresist image 82. At this point an inspection of now patterned second photoresist 80 for defects may be done and repairs performed. Both clear and opaque type defects may be repaired. In FIG. 16 the portion of now patterned more opaque than partially transmissive layer 40 contained within second resist image 82 has been etched and removed, using now patterned second photoresist layer 80 as an etch mask, leaving only partially transmissive attenuating phase-shift layer images 34 in now patterned partially transmissive attenuating phase-shift layer 30 in this region of the mask. In FIG. 17 second photoresist layer 80 has been removed exposing region 12 containing mask images 14 and region 13 containing mask images 16 and 18. Mask image 16 comprises co-aligned partially transmissive attenuating phase-shift layer image 36 and more opaque than partially transmissive layer image 46. Mask image 18 comprises co-aligned partially transmissive attenuating phase-shift layer image 38 and more opaque than partially transmissive layer image 48.

FIGS. 18 through 24 describe a second embodiment for completion of the mask fabrication of the present invention. All the fabrications steps illustrated by FIGS. 7 through 13 and described above, having been completed. Note however, it is not necessary that first image transfer layer 50 be removed in the earlier performed fabrication steps, it being possible to remove first image transfer layer 50 when second image transfer layer 70 shown in FIG. 18 and described below is removed.

Figure 18:
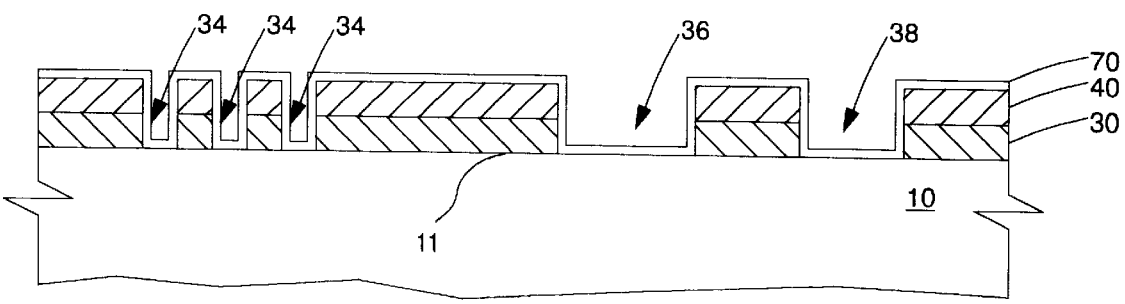
FIGS. 18 through 24 are partial cross-sectional views of successive stages of fabrication of the partially transmissive attenuating phase-shift mask in accordance with another embodiment of the present invention.
Figure 19:
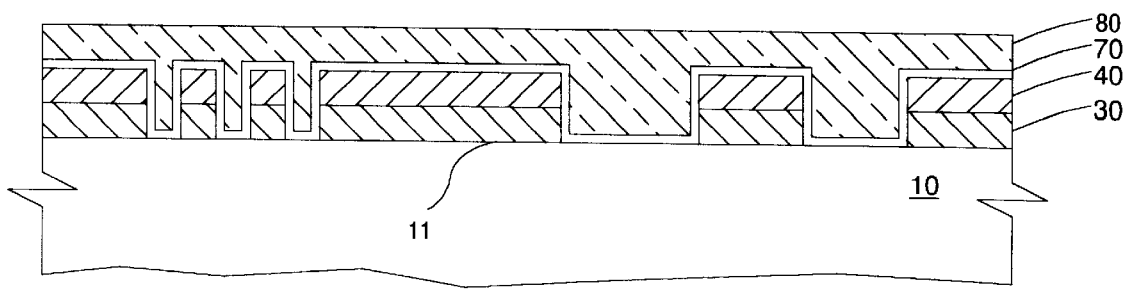
Figure 20:
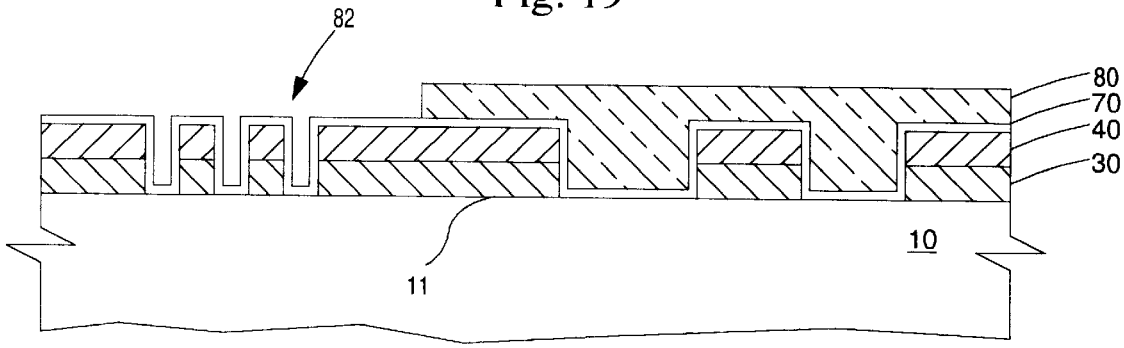
Figure 21:
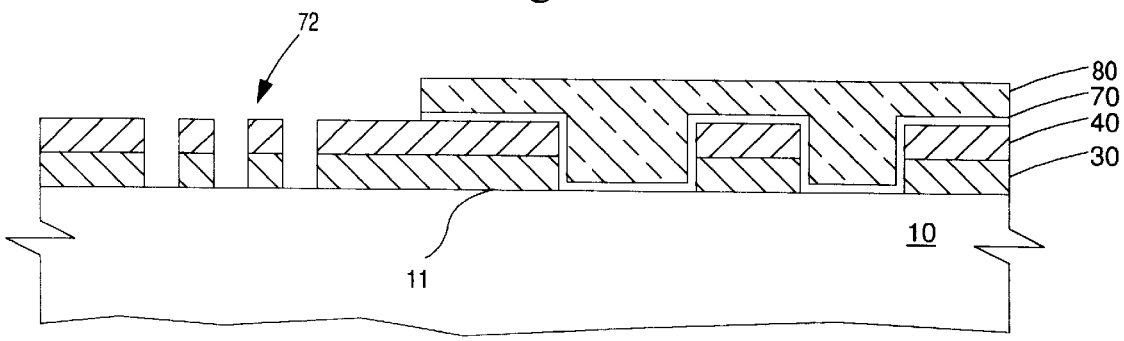
Figure 22:
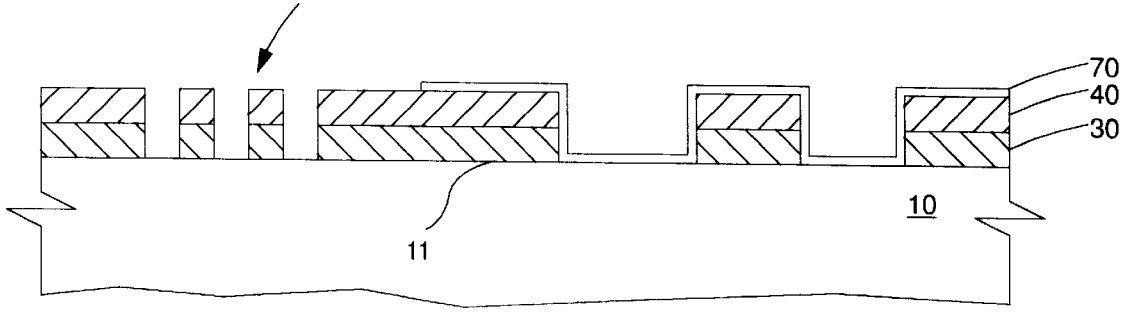

In FIG. 18 second image transfer layer 70 has formed over transmissive substrate 10 and covering more opaque than partially transmissive layer 40 and exposed surface 11 of transmissive substrate 10. Image transfer layer 70 can be used to enhance the sharpness of the transfer images edges from the photoresist image to the underlying layers that might otherwise be lost by erosion or lifting of the photoresist layer during etch of the underlying layers or act as an adhesion promoter for photoresist. It can also serve as a defect repair layer prior to etching the underlying layers. In FIG. 19 second photoresist layer 80 has been formed over second image transfer layer 70. In FIG. 20 second photoresist image 82 has been formed in second photoresist layer 80 by standard mask fabrication exposure and development processes, thereby exposing second image transfer layer 70 at the bottom of second photoresist image 82. In FIG. 21 second image transfer layer 70 has been etched, using now patterned second photoresist layer 80 as an etch mask, forming second image transfer layer image 72 in second image transfer layer 70, thereby exposing more opaque than partially transmissive layer 40 and exposed portions of top surface 11 of transmissive substrate 10 contained within second transfer layer image 72. If second image transfer layer 70 is carbon, for example, etching could be accomplished using a plasma or reactive ion etch using oxygen. In FIG. 22 second photoresist layer 80 has been removed. At this point an inspection of now patterned second image transfer layer 70 for defects may be done and repairs performed. Both clear and opaque type defects may be repaired.

Figure 23:
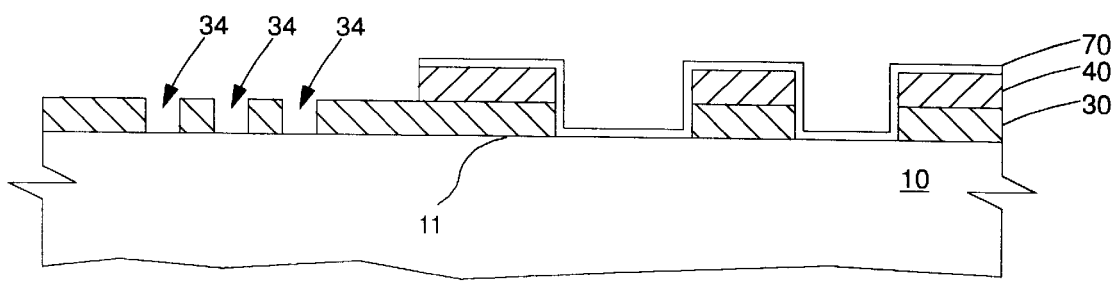
Figure 24:
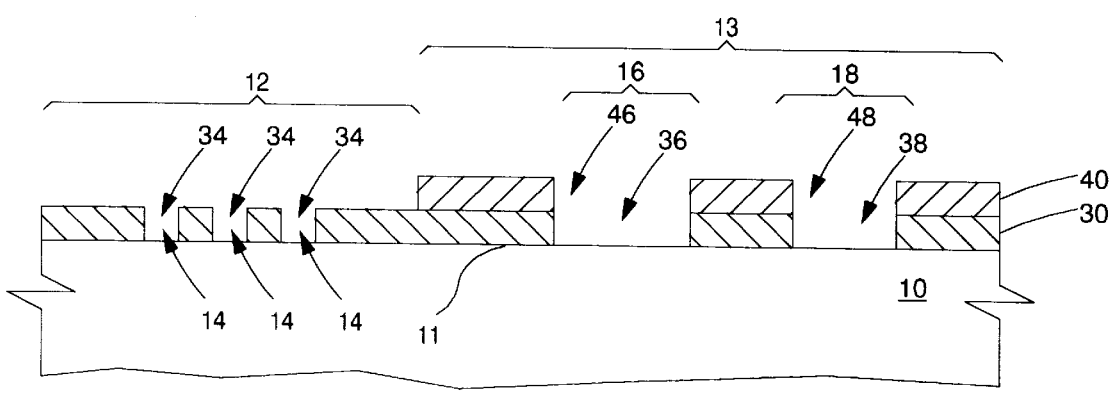

In FIG. 23 the portion of now patterned more opaque than partially transmissive layer 40 contained within second transfer layer image 72 has been etched and removed, using now patterned second image transfer layer 70 as an etch mask, leaving only partially transmissive attenuating phase-shift layer images 34 in now patterned partially transmissive attenuating phase-shift layer 30 in this region of the mask. In FIG. 24 second image transfer layer has been removed exposing region 12 containing mask images 14 comprising partially transmissive attenuating phase-shift layer images 34 formed in partially transmissive attenuating phase-shift layer 30 and region 13 containing mask images 16 and 18. Mask image 16 comprises co-aligned partially transmissive attenuating phase-shift layer image 36 and more opaque than partially transmissive layer image 46. Mask image 18 comprises co-aligned partially transmissive attenuating phase-shift layer image 38 and more opaque than partially transmissive layer image 48.

The description of the embodiments of the present invention is given above for the understanding of the present invention. It will be understood that the invention is not to the particular embodiments described herein, but is capable of various modifications, rearrangements and substitutions will now become apparent to those skilled in the art without departing from the scope of the invention. Therefore it is intended that the following claims cover all such modifications and changes as fall within the true spirit and scope of the invention.

What is claimed is:

1. An optical lithographic phase shift mask that reduces the formation of side-lobes adjacent to larger than nominal device sized structures which may be located in kerf regions on the patterned wafer by the application of more opaque than partially transmissive patterned material over the partially transmissive attenuating layer adjacent to the larger than nominal device sized structures within the kerf.

2. The mask of claim 1 wherein the patterned wafer structure is only larger than nominal in one axis, and therefore, the effects of side-lobe formation are only apparent in the large axis, and as a result the mask is formed such that the addition of more opaque than partially transmissive patterned material is placed only adjacent to the large structure in the large axis.

3. A method of making an optical lithographic mask comprising the steps of: providing a transmissive substrate transmissive to optical radiation, said substrate having a top surface upon which is located a partially transmissive attenuating phase-shift layer;

depositing a more opaque than partially transmissive layer on top of said partially transmissive attenuating phase-shift layer;

depositing a first image transfer layer on top of said more opaque than partially transmissive layer;

patterning said first image transfer layer;

etching said more opaque than partially transmissive layer and said partially transmissive attenuating phase-shift layer using the first patterned image transfer layer as a protective layer against etching said more opaque than partially transmissive layer and using the first patterned image transfer layer or the resulting patterned non-transmissive opaque layer as a protective mask against etching said attenuating phase shift layer;

removing remaining portions of said image transfer layer; and removing selected portions of said more opaque than partially transmissive layer.

4. The method of claim 3 further comprising the steps of: inspecting said patterned transfer layer or more opaque than partially transmissive layer for defects and repairing at least some of the repairable defects found.

5. The method of claim 3, wherein said selected portions of said more opaque than partially transmissive layer are removed from device regions of said optical lithographic mask.

6. The method of claim 3 wherein said partially transmissive phase-shift attenuating layer is selected from the group consisting molybdenum silicide, molybdenum silicide oxynitride and chrome oxynitride.

7. The method of claim 3 wherein said more opaque than partially transmissive layer is selected from the group consisting of chrome, molybdenum, aluminum, tungsten, titanium, molybdenum oxide, aluminum oxide, tungsten oxide, titanium oxide, and chrome oxide.

8. The method of claim 3 wherein said transfer layer is selected from the group consisting of carbon, silicon oxide, silicon nitride, silicon carbide, and photoresist.

9. The method of claim 3 wherein the step of patterning of said image transfer layer is done using a first patterned photoresist layer and includes the further step of removal of the first photoresist layer.

10. The method of claim 3 wherein the step of removing selected portions of said more opaque than partially transmissive layer is done with a second patterned photoresist layer and includes the further step of removal of the second photoresist layer.

11. A method of making an optical lithographic mask comprising the steps of:

providing a transmissive substrate transmissive to optical radiation; said substrate having a top surface upon which is located a partially transmissive attenuating phase-shift layer;

depositing a more opaque than partially transmissive layer on top of said partially transmissive attenuating phase-shift layer;

depositing a first image transfer layer on top of said more opaque than partially transmissive layer;

patterning said first image transfer layer;

etching said more opaque than partially transmissive layer and said partially transmissive attenuating phase-shift layer using the first patterned image transfer layer as a protective layer against etching said more opaque than partially transmissive layer and using the first patterned image transfer layer or the resulting patterned non-transmissive opaque layer as a protective mask against etching said attenuating phase shift layer;

removing selected portions of said more opaque than partially transmissive layer;

depositing a second image transfer layer;

patterning said second image transfer layer;

etching said patterned more opaque than partially transmissive layer using the second patterned image transfer layer as a protective layer against etching said patterned more opaque than partially transmissive layer in first regions of said optical lithographic mask and to expose said patterned attenuating phase-shift layer in second regions of said optical lithographic mask; and removing the first and second patterned image transfer layers.

12. The method of claim 11 wherein the first image transfer layer is removed before deposition of the second image transfer layer.

13. The method of claim 11 further comprising the steps of:

inspecting said first and second patterned transfer layers for defects and repairing at least some of the repairable defects found.

14. The method of claim 11, wherein said second regions are device regions and aid first regions are kerf regions of said optical lithographic mask.

15. The method of claim 11, wherein said partially transmissive phase-shift attenuating layer is selected from the group consisting molybdenum silicide, molybdenum silicide oxynitride and chrome oxynitride.

16. The method of claim 11 wherein said more opaque than partially transmissive layer is selected from the group consisting of chrome, molybdenum, aluminum, tungsten, titanium, molybdenum oxide, aluminum oxide, tungsten oxide, titanium oxide, and chrome oxide.

17. The method of claim 11 where in said transfer layers are selected from the group consisting of carbon, silicon oxide, silicon nitride, silicon carbide, and photoresist.

18. The method of claim 11 wherein said patterning of said first image transfer layers is done using a first patterned photoresist layer and said patterning of said second image transfer layer is done using a second patterned photoresist layer and includes the further step of removal of the first and second photoresist layers.

19. A method of forming an image on a wafer including the steps of:

forming a mask in accordance with the steps of claim 3;

directing optical radiation through the mask to form an aerial image of the mask;

directing the aerial image onto a photoactive layer located on a top surface of said wafer; and developing said photoactive layer to produce said wafer image.

20. A method of forming an image on a wafer including the steps of:

forming a mask in accordance with the steps of claim 11;

directing optical radiation through the mask to form an aerial image of the mask;

directing the aerial image onto a photoactive layer located on a top surface of said wafer; and developing said photoactive layer to produce said wafer image.

21. An optical lithographic phase shift mask that reduces the formation of side-lobes adjacent to larger than nominal device sized structures which may be located in active device regions on the patterned wafer by the application of more opaque than partially transmissive patterned material over the partially transmissive attenuating layer adjacent to the larger than nominal device sized structures within the active device regions on the patterned wafer.

22. The mask of claim 21 wherein the patterned wafer structure is only larger than nominal in one axis, and therefore, the effects of side-lobe formation are only apparent in the large axis, and as a result the mask is formed such that the addition of more opaque than partially transmissive patterned material is placed only adjacent to the large structure in the large axis.

* * * * *